United States Patent
Komuro

(10) Patent No.: US 6,246,279 B1
(45) Date of Patent: Jun. 12, 2001

(54) OUTPUT AMPLITUDE CONTROL CIRCUIT

(75) Inventor: Takanori Komuro, Tokyo (JP)

(73) Assignee: Agilent Technologies, Santa Clara, CA (US)

( * ) Notice: Subject to any disclaimer, the term of this patent is extended or adjusted under 35 U.S.C. 154(b) by 0 days.

(21) Appl. No.: 09/428,612

(22) Filed: Oct. 27, 1999

(30) Foreign Application Priority Data

Oct. 30, 1998 (JP) .................................................. 10-310159

(51) Int. Cl.[7] .................. G06F 7/42; H03L 5/00
(52) U.S. Cl. ............................................. 327/361; 327/306
(58) Field of Search .................................. 327/339, 352, 327/354, 355, 361, 407, 306, 309; 341/144, 126

(56) References Cited

U.S. PATENT DOCUMENTS

| | | | |
|---|---|---|---|
| 5,886,573 | * 3/1999 | Kolanek | 350/10 |
| 5,955,909 | * 9/1999 | Lenz et al. | 327/361 |
| 5,990,819 | * 11/1999 | Fujimori | 341/150 |
| 6,166,583 | * 12/2000 | Kochi et al. | 327/407 |

OTHER PUBLICATIONS

Compact Disk Player DP–75, Accuphase, Inc, 4pp.
MJ Audio Technology, vol. 82, No. 1, 1995, pp50–52.

* cited by examiner

Primary Examiner—My-Trang Nu Ton

(57) ABSTRACT

The invention presents a circuit by which control of the output amplitude of digital analog converters can be carried out at high speed and with high precision. A first digital signal that is the same as the input signal and a second digital signal of a value slightly smaller than an input signal provided from a high-speed processor are selectively applied to plural D-A converters and the output therefrom is added. By changing the ratio with which the first digital signal and the second digital signal are selected, it is possible to control the analog output amplitude.

13 Claims, 3 Drawing Sheets

| SELECTION NUMBER OF FIRST DIGITAL SIGNAL | SELECTION NUMBER OF SECOND DIGITAL SIGNAL | ADDER OUTPUT |
|---|---|---|
| 6 | 0 | $6 + 0 = 6$ |
| 5 | 1 | $5 + \frac{15}{16} = 5.9375$ |
| 4 | 2 | $4 + \frac{30}{16} = 5.875$ |
| 3 | 3 | $3 + \frac{45}{16} = 5.8125$ |
| 2 | 4 | $2 + \frac{60}{16} = 5.75$ |
| 1 | 5 | $1 + \frac{75}{16} = 5.6875$ |
| 0 | 6 | $0 + \frac{90}{16} = 5.625$ |

OUTPUT AMPLITUDE CONTROL CIRCUIT

FIELD OF THE INVENTION

The present invention pertains to an output amplitude control circuit and, more particularly, to an output amplitude control circuit of a digital analog converting circuit that is appropriate for use in an arbitrary signal generator with which digital waveform data are applied to digital analog converters to generate analog signals.

BACKGROUND OF THE INVENTION

There are cases where it is necessary to adjust output amplitude without changing the iput digital waveform data in arbitrary signal generators (AWGs) and audio signal sources, etc., with which digital waveform data are input to a digital analog converter (D-A converter; DAC) and analog signals are generated.

FIG. 1 is a conventional circuit with which fixed resistor 102 and relay 103 are connected to the output of a D-A converter (not illustrated) via analog input 101, and the relay switch is switched and controlled by relay control circuit 106 in order to adjust the amplitude of analog output. The desired amplitude is obtained from analog output 104 based on the combination in which the relay switches are connected and disconnected. However, there is a problem with this structure in that it is necessary to use high-precision resistors and therefore, its cost is high. Moreover, many resistors and relays are needed for precise control of resolution and therefore, there are limits to the capability of such a system. Furthermore, there is a disadvantage in that because operating speed of the relays is slow, high-speed amplitude control is not possible. In addition, there is a problem in that the parts are large and miniaturization of the circuit is impossible.

FIG. 2 is another conventional circuit which, using a digital filter as digital multipiler 202, the amplitude of the analog output of D-A converts is adjusted by multiplying a proportional coefficient by the input digital signals and inputting to D-A converter 201. However, by means of this structure, there is a problem since there are limits to the operating speed of the digital multiplier, and high-speed operation is impossible.

FIG. 3 is yet another conventional circuit that uses D-A converter (multiplying-type DAC) 301 with which the reference voltage for D-A conversion can be adjusted to generate reference voltage Vref by D-A converter 302 and add it to D-A converter 301. However, there is a problem in that when this type of structure is used, D-A converter 301 that can use reference voltage is necessary and reference voltage Vref is an analog value and noise can easily increase. Inserting an analog filter between D-A converter 301 and D-A converter 302 has been considered to prevent this noise from being generated, but there is a disadvantage in this case in that high-speed control of DAC output amplitude is not possible.

SUMMARY OF THE INVENTION

The present invention eliminates the disadvantages of the abovementioned prior art, its purpose being to present an amplitude control circuit wherein parts that slow operating speed, such as relays, digital multipliers, analog filters, etc., are omitted and high-speed operation is therefore possible. Another purpose is to easily produce a high-precision amplitude control circuit wherein the effects of changes attributed to part precision and drift that occur with analog circuits can be eliminated by adjusting the signal amplitude using a digital circuit. Yet another purpose is to eliminate the necessity of using many high-precision parts, particularly high-precision resistors, and to make possible the use of D-A converters that are not multiplying converters, particularly D-A converters that are marketed for audio use, and thereby reduce cost.

In short, the present invention (1) is characterized in that it is an output amplitude control circuit of a digital analog converting circuit with the following structure:
(1) a multiple nimber of digital analog converters
(2) an input signal converting circuit that receives input digital signals and outs a first digital signal and a second digital signal that have a specific relationship with said input digital signals and have different values
(3) a multiple number of switches that connect with each of the digital analog converters that selectively apply the first digital or second digital signal to the digital analog converters
(4) an adder that adds the output of the multiple number of digital analog converters
(5) a means whereby the analog output amplitude is adjusted by changing the ratio of selection of the first digital signal or second digital signal by the nmltiple number of switches In addition, the present invention (2) is characterized in that it is an output amplitude control circuit of a digital analog converting circuit with the following structure:
(1) a multiple number of digital analog converters
(2) an input signal converting circuit that receives input digital signals and outputs a first digital signal and a second digital signal that have a specific relationship with said input digital signals and have different values
(3) a multiple number of switches that connect with each of the digital analog converters that selectively apply the first digital or second digital signal to said digital analog converters
(4) an adder that adds the output of the multiple number of digital analog converters
(5) an attenuator connected to said adder output that can establish a multiple number of attenuated fixed values
(6) a means whereby the amplitude is controlled to less than the resolution of the attenuated fixed value that can be established by the attenuator by changing the ratio of selection of the first and second digital signals by the multiple number of switches Moreover, the present invention (3) is characterized in that, in the present invention (1) or (2), the input signal converting circuit allows the input digital signals to pass through as the first digital signal, while it performs a specific type of operation on the input digital signals to obtain the second digital signal Moreover, the present invention (4) is characterized in that a slightly smaller value than the value of the input digital signals is obtained by the specific type of operation in present invention (3).

Moreover, the present invention (5) is characterized in that operation to obtain a slightly smaller value than the value of the input digital signals in present invention (4) is: ((nth power of 2)—1)/(nth power of 2)).

Moreover, the present invention (6) is characterized in that the circuit that performs the operation of ((nth power of 2)—1)/(nth power of 2) in present invention (5) comprises a shift register connected to the input, a sign inversion circuit connected to the output of said shift register, and an adder that adds said sign inversion circuit output and the input signals from the input.

Moreover, the present invention (7) is characterized in that the value of n is 4 and the number of digital analog converters and switches is 6 each in present invention (5) or (6).

Moreover, the present invention (8) is characterized in that the input digital signals are parallel signals, the digital analog converters are serial signal input-type converters, and a parallel-serial converter is connected to the first digital signal output and second digital signal output of the input signal converting circuit in present inventions (1) through (8).

Moreover, the present invention (10) is characterized in that switch control circuits that receive amplitude control signals and control each switch are connected to the switches in present inventions (1) through (9).

Moreover, the present invention (11) is characterized in that it is an output amplitude control circuit of a digital analog converting circuit with the following structure:
(1) a multiple number of digital analog converters
(2) an input signal converting circuit that receives input digital signals and outputs a multiple number of intermediate digital signals that have a specific relationship with said input digital signals and have different values
(3) a multiple number of switches that connect with each of the digital analog converters that can connect so that at least any of the intermediate digital signals will be applied to said digital analog converter
(4) an adder that adds the output of the multiple number of digital analog converters
(5) a means whereby the analog output amplitude from the adder is adjusted by controlling the multiple number of switches Moreover, the present invention (12) is characterized in that it is an output amplitude control circuit of a digital analog converting circuit with the following structure:
(1) A multiple number of digit analog converter groups made so that there is a slight difference in the analog output vahles with respect to the same digital input among different groups, while the same analog output value is output for the same digital input whithin the same group, in accordance with the desired width and resolution of the amplitude control
(2) An adder that adds the digital analog converters
(3) A multiple number of switches that control connection of the input digital signals with the digital analog converter
(4) A means whereby the analog out amplitude from the adder is adjusted by controlling the switches so that the total number of switches connected to the digital analog converters is constant and the ratio of the digital analog converter groups that will connect is changed.

Moreover, the present invention (13) is characterized in that it is an amplitude control circuit with the following structure:
(1) A multiple nuber of digital analog converters
(2) An input signal converting circuit that receives input digital signals and outputs a multiple number of intermediate digital signals that have a specific relationship with said input digital signals and that have different values
(3) A multiple number of switches that connect with each of the digital analog converters and can connect in order to apply at least any of the intermediate digital signals to said digital analog converters
(4) An adder that adds the output of the multiple number of digital analog converters
(5) A means whereby analog output amplitude from the adder is changed by controlling the multiple number of switches in synchronization with the input digital signals Moreover, the present invention (14) is characterized in that it is an output amplitude control circuit of a digital analog converting circuit with the following structure:
(1) A multiple number of digital analog converters
(2) An imput signal converting circuit that receives input digital signals and outputs a first digital signal and a second digital signal that have a specific relationship with said input digital signal and have different values
(3) An adder that can add the output of the multiple number of digital analog converters
(4) A means whereby the total number of the multiple number of digital analog converters that add output to said adder is held constant and the ratio of the number of the digital analog converters that receive input of the first digital signal and the number of the digital analog converters that receive input of the second digital signal is changed.

DETAILED DESCRIPTION OF THE INVENTION

Figure 4:
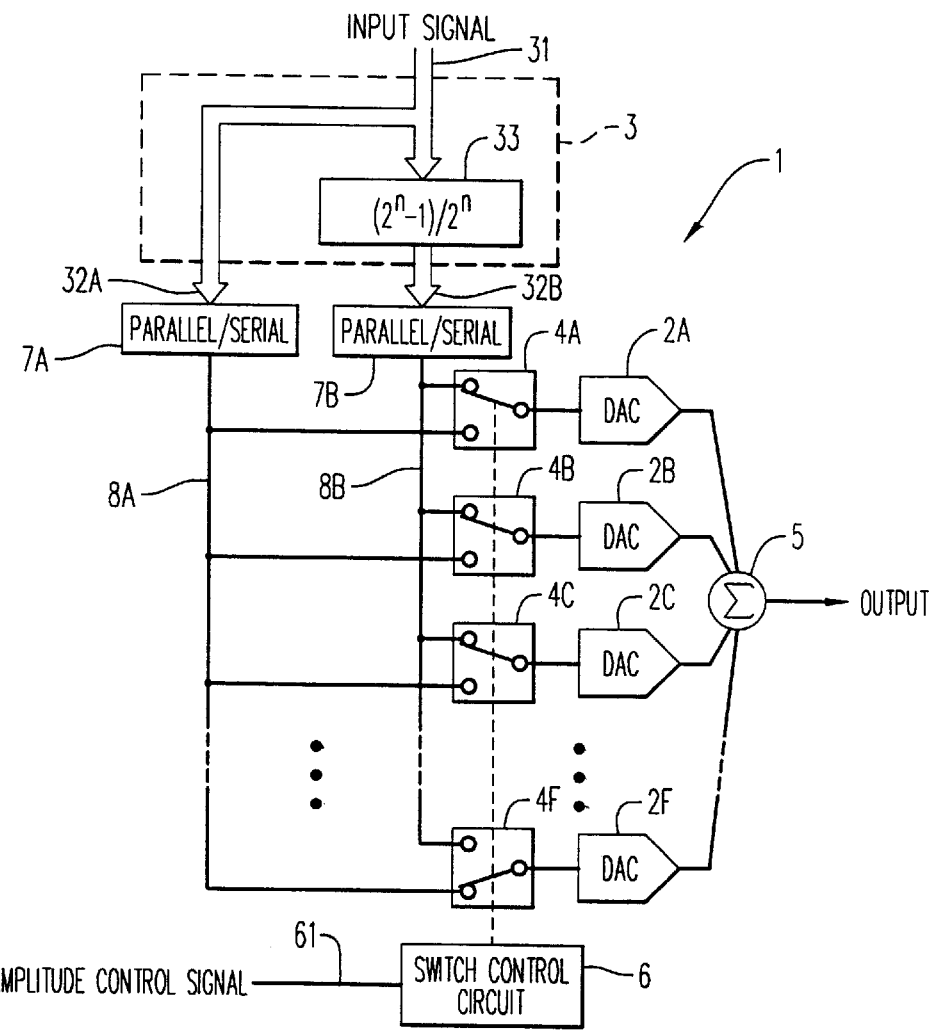
FIG. 4 is a diagram of an example of the amplitude control circuit of a digital analog converting circuit of the present invention.

The present invention will now be described based on the examples in the figures. As shown in FIG. 4, output amplitude control circuit 1 of a digital analog converting circuit of the present invention has a multiple number of digital analog converters 2A through 2F, input signal converting circuit 3, a multiple number of switches 4A through 4F, and an adder 5.

Digital analog converters 2A through 2F are serial digital input-type converters and six converters with the same structure are lined up in a row. A commercial audio DAC is used here.

Input signal converting circuit 3 receives parallel input digital signals 31 and outputs first digital signal 32A and second digital signal 32B that have a specific relationship with input digital signal 31 and have different values. First digital signal 32A is input digital signal 32 that has been allowed to pass through as is and output, while second digital signal 32B is processed from the input digital signal by operation circuit 33 to obtain a slightly smaller value than input digital signal 31 and then output. In actual terms, multiplication of (nth power of 2)—1/(nth power of 2) is performed on the value of the input digital signal and output. In the present example, n=4 and multiplication of 15/16 is performed. Operation by operation circuit 33 is performed by a special logic circuit and not an ordinary multiplier, and therefore, high-speed operation is possible. This logic circuit will be described later while referring to FIG. 5.

First and second digital signals 32A and 32B are parallel signals and are converted to serial signals by parallel-serial converters 7A and 7B to obtain serial first digital signal 8A and second digital signal 8B, respectively.

Switches 4A through 4F each connect with the respective digital analog converter 2A through 2F and operate so that the first digital signal 8A or the second digital signal 8B is selectively applied to the digital analog converters by switch control circuit 6 based on amplitude control signals. By means of the present example, a comnercial digital analog converter integrated circuit with input selectors attached was used for digital analog converters 2A through 2F, and the input selectors of this digital analog converter integrated circuit were used for switches 4A through 4F.

Adder 5 is an ordinary analog adder that uses a processing amplifier and is connected so that the analog outputs of digital analog converters 2A through 2F are added. The output of adder 5 comprises the output of this digital analog converting circuit.

Switch control circuit 6 adjusts the analog output amplitude of adder 5 by receiving amplitude control signal 61 and changing the ratio of the number of switches 4A through 4F selecting first digital signal 8A and the number selecting second digital signal 8B in order to change the analog output amplitude output by D-A converters 2A through 2F.

Figures 5, 6:
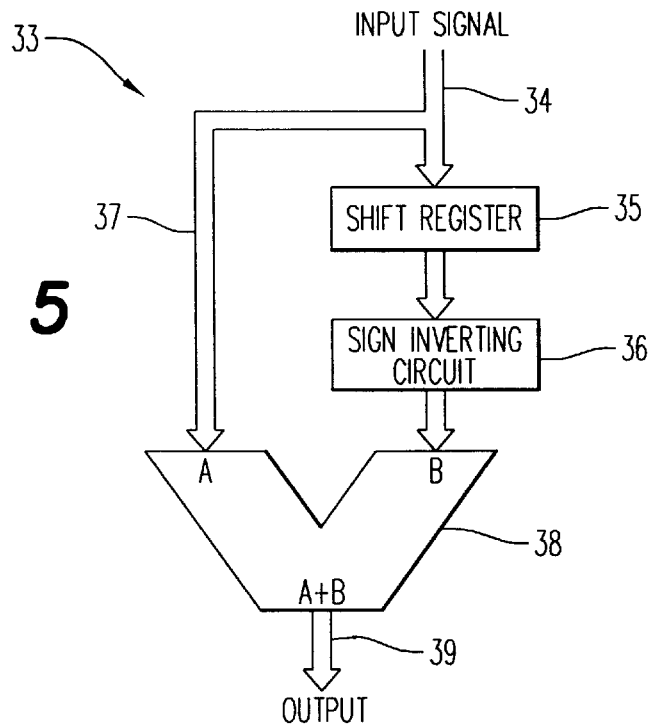
FIG. 5 is a block diagram of the internal structure of operation circuit 33 of the example in FIG. 4.
FIG. 6 is a diagram that explains an example of output of the amplitude control circuit in the example in FIG. 4.

As shown in FIG. 5, operation circuit 33 comprises shift register 35, which connects with input 34 and performs bit shifting; sign inversion circuit 36, which is connected to the output of shift register 35; and adder 38, which adds said sign inversion circuit output and input signal 37 from the abovementioned input. The output of adder 38 comprises output 39 of operation circuit 33.

The example of the present invention is produced as described above and an example of its operation will now be described. In order to simplify the description, the value of the analog output when input signal 31 is input to D-A converters 2A through 2F will be 1. FIG. 6 is a table comparing tbe number of switches 4A through 4F that select first and second digital signals and adder output. As is clear from this table, by changing the selection of each signal between a maxim amplitude control of 6 where all swiches select the first digital signal and a minimum amplitude control of 6×(15/16)=90/16=5.625 where all switches select the second digital signal, it is possible to control the adder output to a value that has an intermediate amount of attenuation. Moreover, although it is often necessary to adjust the amplitude of analog signals logarithmically, a structure of 6 individual D-A converters as in this example is often more convenient, as shown by the results of the experiments.

Figure 1:
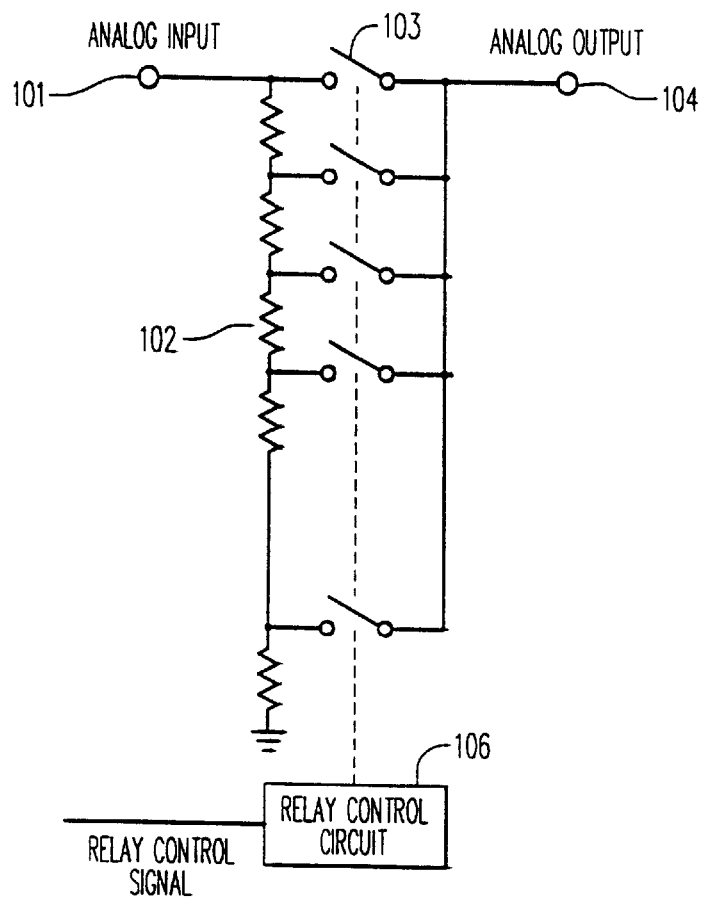
FIG. 1 is a diagram of a conventional fixed resistor-type attenuation circuit.
Figure 2:
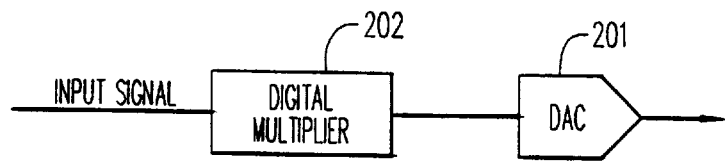
FIG. 2 is a diagram of a conventional amplification control circuit with a digital multiplier.
Figure 3:
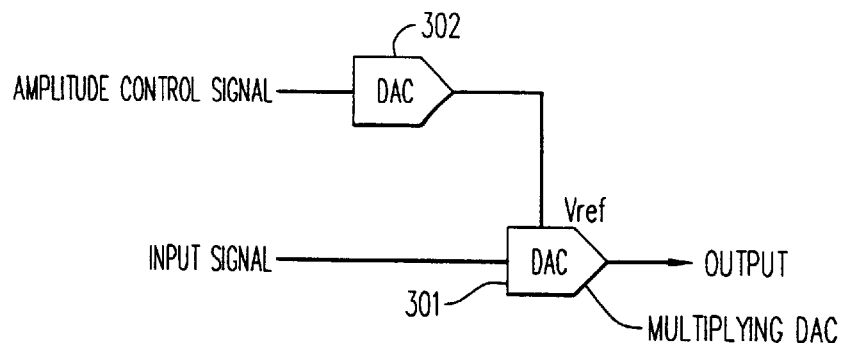
FIG. 3 is a diagram of a conventional reference voltage controltype amplitude control circuit.

Furthermore, the above example has described the amplitude control as the selective control of two digital signal inputs that are input to a multiple number of D-A converters, but it is also possible to use the above structure to control the amplitude so that it is less than the resolution of the attenuated fixed value in FIG. 1 with the attenuator in FIG. 1 of a conventional example connected to the output of adder 5.

Moreover, the above example has been described with operation circuit 33 performing the operation of ((nth power of 2)—1)/(nth power of 2)), but the operation is not limited to this example, and a variety of operations can be performed in order to generate second digital signals with a specific difference from the first digital signals, depending on the width and resolution of the output amplitude that is needed. For instance, another multiplication can be performed. In addition, the operation is not limited to multiplication and any conventional high-speed operation that is suitable for the purpose of amplitude control in the present invention can be used.

Similarly, first digital signal 32A was described in the above example as the result when input signal 31 is allowed to pass through as is and output. However, this signal can also be obtained by being output through an operation circuit that performs conventional high-speed operation. Furthermore, by means of the above example, operation circuit 33 has a structure with which a value slightly smaller than the input signal was obtained, but it is also possible to use a structure with which a value slightly larger than the input signal is obtained. However, since a digital signal cannot be input that exceeds the maximum value that can be input to the digital analog converter, the "value that is slightly smaller than the input signal" that will be output from the operation circuit cannot exceed the maximum value that can be input to the digital analog converter in other examples.

Moreover, although the above example has been described with first digital signal 32A being output after input signal 31 has been allowed to pass through as is, if the delay by operation circuit 33 cannot be disregarded for high-speed operation of the entire circuit, a delay circuit can be applied to the first digital signal to match the timing with the second digital signal.

Moreover, the above example has been explained with 6 individual digital analog converters. This is used for explanation, because it is probably optimal in terms of cost:performance ratio and critical effect. However, it goes without saying that the number of digital analog converters is not limited to 6. There can be fewer than 6, or more than 6 can be selected, depending on the width and resolution of amplitude control that is needed for the purpose of use of the present invention.

Moreover, the above example has been described with digital analog converters 2A through 2F having serial inputs. As a result, switches 4A through 4F can have a simple structure. However, it is also possible to use digital analog converters of parallel inputs. In this case, switches 4A through 4F are parallel signal selectors and parallel-serial converters 7A and 7B are omitted.

In addition, digital signals that are input to the D-A converter in the above example are alternately selected between 2 signals, a first digital signal and a second digital signal, but the converters can also be controlled so that one of the signals is not selected. For instance, it is possible to control the system so that only some of the D-A converters select signals. Moreover, analog signal output can be blocked when all converters select 0 input. That is, this blocking of output can be performed at a high speed in the present invention.

In addition, the digital signals that are input to the D-A converters in the abovementioned example are 2 signals, the first digital signal and the second digital signal, but there can be 3 or more signals. By selecting this multiple number of digital signals as appropriate, it is possible to obtain the desired amplitude control.

In addition, the abovementioned example was described with 2 types of signals with different digital weighting being used (first digital signal and second digital signal 8A and 8B) and the amount of signal attenuation being controlled by switching between these signals. However, it is also possible to use signals that have been weighted by analog output. In this case, when weighted by each analog output, for instance, the control circuit has a multiple number of digital analog converter groups that are made so that there is a slight difference between the analog output values for the same digital input among different groups and the same analog output value is output for the same digital input among the groups, depending on the desired width and resolution of amplitude control, an adder that adds the output of the abovementioned digital analog converters, and a multiple number of switches that control the connection of the input digital signals to the abovementioned digital analog converters, and the analog output amplitude from the abovementioned adder can be controlled by keeping the number of switches that connect to the abovementoned digital analog converters constant and changing the ratio of the abovemendoned digit analog converter groups that will comect.

In addition, the abovementioned example was described as an "amplitude control" circuit, but switches 4A through 4F can be easily controlled during the refresh period of input signal 31. In this case, the abovementioned example operates as an amplitude modulatig circuit.

Moreover, by means of the abovementioned example, switches 4A through 4F are in front of the D-A converters and selectively input the first and second digital signals to the D-A converters, with the output of all of the D-A converters being connected to the adder. However, it is also possible to use a structure where switches connect between the D-A converters and the adder and the member of D-A converters that connect with the adder is changed by controlling these switches. For instance, it is possible to control analog output amplitude from the adder by controlling the system so that the total number of switches connected to the adder from the D-A converter group that receives input of the first digital signal and from the D-A converter group that receives input of the second digital signal both remain constant, while the ratio of the number of both groups that will connect changes. It is also possible to concomitmanty use a structure where the switches are in front of the D-A converters with a structure where they are in back of the converters.

The present mvention has the abovementioned structure and effects, and therefore, the amount of attenuation of the output signals can be digitally determined in order to present a high-precision amplitude control circuit that is unaffected by part precision, drift, and other variables. In addition, since the amount by which off signal are attenuated is determined by a digital circuit, the noise from the analog signals that are output is reduced. In addition, the switches that switch the digital signals that are input to the D-A converters are selectors from a gate circuit, which makes high-speed operation possible. Furthermore, the operation circuit provides a value slightly smaller than the input digital signal, and therefore, high-speed operation by a simple structure is possible and there is no need for parts that inhibit operating speed, such as relays, digital multipliers, analog filters, etc. Thus, high-speed amplitude control is possible. Furthermore, as a result, amplitude can be changed in synchronization with the input signals and the circuit can be used as an amplitude modulation circuit. Furthermore, there is no need for expensive parts, such as many high-precision resistors, high speed ordinary multipliers, multiplication-type D-A converters, etc., and therefore, it is possible to present an inexpensive high-performance amplification control circuit. Furthermore, a conventional fixed resistor-type attenuation period can be concomitantly used, and therefore, it is possible to present an amplitude control circuit with which it is possible to control coarse resolution and fine resolution by the amplitude control circuit and attenuator, respectively, and realize good balance in terms of the cost:performance ratio. Furthermore, serial input D-A converters can be employed, and therefore, audio D-A converters that are easily obtained can be employed. Moreover, it is possible to obtain an amplitude control circuit that is suitable for even logarithmic control with a simple structure of 6 individual D-A converters. In addition, it is possible to use a design with a high degree of freedom in that 3 or more digital signals are selected as needed and input to a multiple number of D-A converters, and therefore, it is possible to design an amplitude control circuit for a specific purpose.

What is claimed is:

1. An output amplitude control circuit for a digital-analog converting circuit, comprising:

plural digital/analog converters;

an input signal converting circuit for receiving an input digital signal and outputting first and second digital signals that have a specific relationship with said input digital signal and have different values;

plural switches for selective connection with the digital/analog converters and for applying the first digital signal or the second digital signal from said input signal converting circuit to said digital/analog converters;

an adder for adding the outputs of the plural digital/analog converters; and control circuit means coupled to said plural switches for operating said plural switches to change a ratio of said first digital signals and second digital signal applied to said digital/analog converters so as to control an analog output amplitude from said adder.

2. An output amplitude control circuit according to claim 1, wherein the input signal converting circuit allows the input digital signal to pass through as the first digital signal and processes the input digital signal by altering it in a determined manner into the second digital signal.

3. An output amplitude control circuit according to claim 2, wherein said input signal converting circuit processes the input digital signal by altering it to have a smaller value than a value of the input digital signal.

4. An output amplitude control circuit according to claim 3, wherein said smaller value is determined from: ((nth power of 2)—1)/(nth power of 2).

5. An output amplitude control circuit according to claim 4, wherein said input signal converting circuit that processes the input digital signal in accord with ((nth power of 2)—1)/(nth power of 2), comprises a shift register connected to the input, a sign inversion circuit connected to the output of said shift register, and an adder that adds said sign inversion circuit output and the input signals from the iput.

6. An output amplitude control circuit according to claim 4 wherein the value of n is 4 and the nunber of the plural digital/analog converters and switches is 6, respectively.

7. An output amplitude control circuit according to claim 2, wherein the input signal converting circuit includes a first digital signal delay circuit for matching timing with the second digital signal that has been delayed by the altering thereof.

8. An output amplitude control circuit according to claim 1, wherein the input digital signals are parallel signals, the digital analog converters are serial signal input-type converters, and a parallel-serial converter is connected to the first digital signal output and the second digital signal output of the input signal converting circuit.

9. An output amplitude control circuit for a digiml-analog converting circuit, comprising:

plural digital/analog converters;

an input signal converting circuit for receiving an input digital signal and outputting first and second digital signals that have a specific relationship with said input digital signal and have different values relating to a desired magnitude and resolution of output amplitude control;

plural switches for selective connection with the digital/analog converters and for applying the first digital signal or the second digital signal from said input signal converting circuit to said digital/analog converters;

an adder for adding the outputs of the plural digital/analog converters;

control circuit means coupled to said plural switches for operating said plural switches to change a ratio of said first digital signal and second digital signal applied to said digital/analog converters so as to control an analog output amplitude from said adder; and an attenuator connected to said adder output for establishing a multiple number of attenuated fixed values, whose amplitudes are controlled to be less than a resolution of the attenuated fixed values that can be established by the attenuator, as a result of said control of the analog output from said adder by selection of the ratio of the first and second digital signals by control of the plural switches.

10. An output amplitude control circuit of digital analog converting circuits, comprising:

plural digital analog converters;

an input signal converting circuit, which receives input digital signals and outputs plural intermediate digital signals that have a specific relationship to said input digital signals and that have different values;

plural switches adapted to connect with each of the digital analog converters to enable addition of any of the intermediate digital signals from the digital analog converters;

an adder that adds the outputs of the plural digital analog converters; and means for controlling the plural switches so as to adjust the analog output amplitude from the adder.

11. An output amplitude control ciit of a digital analog converting circuit, comprising:

plural digital analog converter groups, which are configured so that there is a difference between an analog output value for one digital input signal among different groups and so that a same analog output value is output that is the same as the digital input signal within the same group in accordance with a desired magnitude and resolution of amplitude control;

an adder that adds the output of the plural digital analog converters;

plural switches that control connection of the input digital signals to the plural digital analog converters; and means for adjusting the analog output amplitude from the adder by controlling the switches so that the total number of switches connecting to the plural digital analog converters is constant and the ratio of the digital analog converter groups that connect is changed.

12. An amplitude control circuit, comprising:

plural digital analog converters;

an input signal converting circuit for receiving input digital signals and outputting plural intermediate digital signals that have a specific relationship with said input signals and have different values;

plural switches which connect with the plural digital analog converters and can connect so that any of the intermediate digital signals will be output to said digital analog convertrs;

an adder for adding the outputs of the plural digital analog converters; and means for controlling the analog output amplitude from the adder is changed by controlling the plural number of switches in synchronization with the input digital signals.

13. An output amplitude control circuit of a digital analog converting circuit, comprising:

plural digital analog converters;

an input signal converting circuit for receiving input digital signals and for outputting a first digital signal and a second digital signal that have a determined relationship with said input digital signals and have different values;

adder means for adding the outputs of the plural digital analog converters, and for assuring that a total number of the plural digital analog converters whose outputs will be added by said adder are kept constant while the ratio of the number of the digital analog converters that receive inputs of the first digital signal and the number of plural digital analog converters that receive inputs of the second digital signal is changed.

* * * * *

UNITED STATES PATENT AND TRADEMARK OFFICE
CERTIFICATE OF CORRECTION

PATENT NO.    : 6,246,279 B1
DATED         : June 12, 2001
INVENTOR(S)   : Takanori Komuro Page 1 of 1

It is certified that error appears in the above-identified patent and that said Letters Patent is hereby corrected as shown below:

Column 8, claim 5,
Line 44, "iput" should read -- input --

Column 8, claim 6,
Line 46, "nunber" should read -- number --

Column 8, claim 9,
Line 59, "digiml" should read -- digital --

Column 9, claim 11,
Line 37, "ciit" should read -- circuit --

Signed and Sealed this

Fifteenth Day of January, 2002

Attest:

Attesting Officer

JAMES E. ROGAN
Director of the United States Patent and Trademark Office